United States Patent [19]

Salatino

[11] Patent Number: 5,117,282
[45] Date of Patent: May 26, 1992

[54] STACKED CONFIGURATION FOR INTEGRATED CIRCUIT DEVICES

[75] Inventor: Matthew M. Salatino, Satellite Beach, Fla.

[73] Assignee: Harris Corporation, Melbourne, Fla.

[21] Appl. No.: 604,883

[22] Filed: Oct. 29, 1990

[51] Int. Cl.⁵ .......................... H05K 7/20; H05K 3/30; H05K 1/04
[52] U.S. Cl. ........................ 357/81; 357/80; 357/78; 357/79; 361/398
[58] Field of Search .............. 357/70, 81, 74, 72, 357/79, 78; 361/398

[56] References Cited

U.S. PATENT DOCUMENTS

| | | | |
|---|---|---|---|
| 3,152,288 | 10/1964 | Mittler | 361/398 |
| 3,505,570 | 4/1970 | Sprude et al. | 361/398 |
| 3,766,439 | 10/1973 | Isaacson | 361/398 |
| 3,819,989 | 6/1974 | Braune | 361/398 |
| 3,873,889 | 3/1975 | Leyba | 361/398 |
| 3,971,127 | 7/1976 | Giguere et al. | 361/398 |
| 4,781,601 | 11/1988 | Kuhl et al. | 361/398 |
| 4,970,579 | 11/1990 | Arldt et al. | 357/81 |

FOREIGN PATENT DOCUMENTS

| | | | |
|---|---|---|---|
| 2262729 | 12/1972 | Fed. Rep. of Germany . | |
| 2344203 | 10/1977 | France . | |
| 56-105659 | 8/1981 | Japan . | |
| 58-171689 | 10/1983 | Japan | 361/398 |
| 58-201349 | 11/1983 | Japan . | |
| 61-105859 | 5/1986 | Japan . | |

Primary Examiner—Andrew J. James
Assistant Examiner—Viet Q. Nguyen
Attorney, Agent, or Firm—Evenson, Wands, Edwards, Lenahan & McKeown

[57] ABSTRACT

A stacked packaging assembly for a plurality of integrated circuit devices employs a web of flexible interconnect material folded into a 'layered' arrangement of parallel web fingers onto which a plurality of integrated circuit devices are surface-mounted. The leads of the integrated circuit devices are attached to interconnect links of the flexible interconnect web. A plurality of heat sink plates are interleaved with the folded web fingers of the stack, so as to engage the integrated circuit devices mounted on the web fingers. The heat sink plates are retained by thermally conductive spacer blocks along their edges. The spacer blocks are clamped together in a compact laminate structure, so as to form a rigid support which relieves mechanical stresses at the folds of the web fingers.

8 Claims, 2 Drawing Sheets

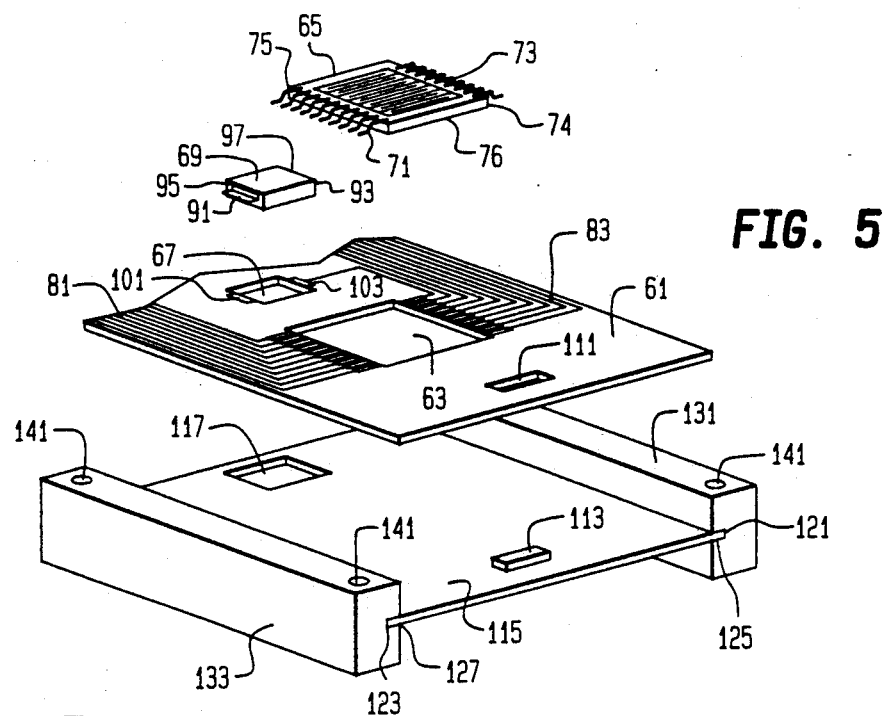
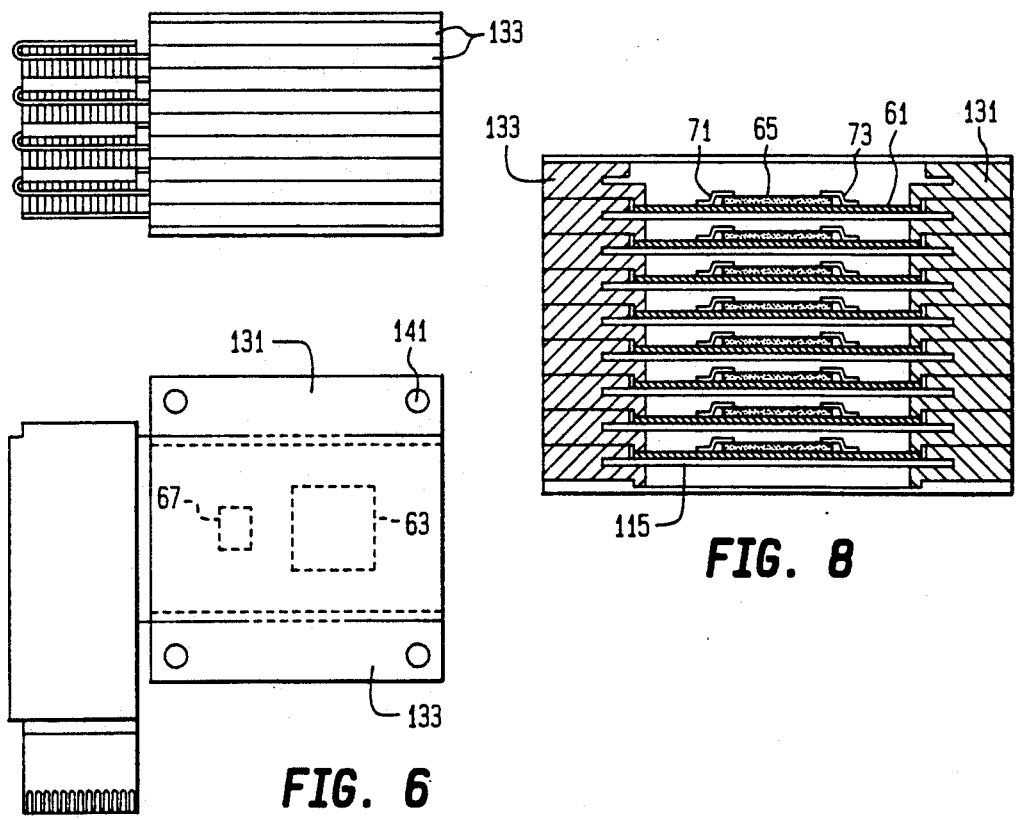

STACKED CONFIGURATION FOR INTEGRATED CIRCUIT DEVICES

FIELD OF THE INVENTION

The present invention relates in general to integrated circuit packaging assemblies and is particularly directed to the stacking of a plurality of integrated circuit devices by multiple folding of a flexible interconnect web upon which the devices are mounted.

BACKGROUND OF THE INVENTION

Integrated circuits are typically packaged in a single chip or 'monolithic' configuration which, in turn, is soldered or plugged into a printed circuit board, or other type of interconnect support substrate. In a multichip 'hybrid' package, several devices are assembled into a single package. Such a packaging scheme has the advantages of reduced weight, size and, occasionally, circuit performance. In an effort to further enhance packaging density, edge-wise or vertically stacked multi-chip packaging assemblies have been proposed. In such configurations, rather than array a plurality of devices in what is essentially a single dimensional, or planar, layout, the devices are arranged on top of one another in a 'stack' or 'layered' assembly.

SUMMARY OF THE INVENTION

The present invention is directed to method of forming such a stacked packaging assembly and is particularly directed to the stacking of a plurality of integrated circuit devices by employing a web of flexible interconnect material that is readily folded into a 'layered' arrangement of parallel web fingers onto which a plurality of integrated circuit devices may be mounted. The flexible interconnect circuit web has a first web portion, from one side of which a first plurality of spaced apart web fingers extend parallel to one another, and from another side of which a second plurality of spaced apart web fingers extend parallel to one another and parallel to the first plurality of web fingers. The second web fingers are longer than the first web fingers and are folded across the first web portion, so as to be interleaved with the first web fingers along the one side of the first web portion. The interleaved first and second web fingers are then folded so as to form a stack of parallel flexible interconnect web fingers 'vertically' separated from one another by the displacement imparted by folds therebetween.

The web fingers have integrated circuit devices surfacemounted to device receiving regions such that leads of the integrated circuit devices are attached to interconnect links of the flexible interconnect web. A plurality of heat sinks in the form of thin thermally conductive plates (heat sink plates) are interleaved with the folded web fingers of the stack, so as to engage the integrated circuit devices mounted on the web fingers. The heat sink plates are retained by thermally conductive spacer members in the form of spacer blocks along edge regions of the plates. The spacer blocks are clamped together in a compact laminate structure, so as to form a rigid support which relieves mechanical stresses in the folds of the web fingers.

The folded web fingers and the heat sink plates also contain mutually engageable alignment elements such that an alignment element (tab) of a respective heat sink plate engages an alignment element (tab-receiving slot) of a respective web finger. In addition, the web fingers have chip capacitor-mounting regions adjacent to the mounting locations of the integrated circuit devices for receiving chip capacitors Chip capacitors are surface mounted at the chip capacitor mounting regions of the web fingers such that leads of the chip capacitors are connected to interconnect links of the flexible interconnect web. The heat sink plates also contain chip capacitor mounting regions have juxtaposed chip capacitor openings for accommodating chip capacitors that are surface mounted on adjacent folded web fingers.

BRIEF DESCRIPTION OF THE DRAWINGS

FIG. 5 is a partially exploded view of an individual layer of a stacked packaging assembly in accordance with the present invention; and FIGS. 6, 7 and 8 are respective top, side and end views of a stacked packaging assembly of the present invention.

DETAILED DESCRIPTION

Referring now to FIGS. 1-4, the respective steps of the sequential folding of a flexible interconnect circuit web to form a stack of integrated circuit device-supporting web fingers in accordance with the present invention will be described. For purposes of clarity, respective integrated circuit devices and chip capacitors that have been surface-mounted to associated apertures in the web fingers (to be described more fully below with reference to FIG. 5) are omitted from FIGS. 1-4.

Figure 1:
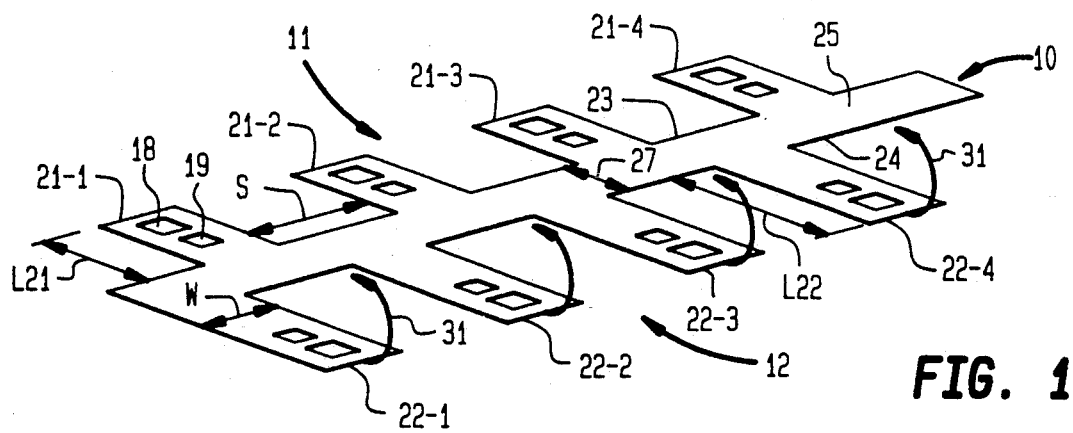
FIGS. 1-4 are respective views, taken in perspective, of the sequential folding of a flexible circuit web to form a stack of integrated circuit device supporting web fingers.

As shown in FIG. 1, the flexible interconnect circuit web 10 itself is configured in a comb-like arrangement of first and second pluralities 11 and 12 of web fingers 21 and 22, respectively extending from opposite sides 23 and 24 of a central web portion 25. Flexible interconnect web 10 may comprise Flex Film, manufactured under the name R-Flex by Rogers Corporation, or other commercially available flexible interconnect. In the illustrated embodiment, first plurality 11 contains four web fingers 21-1 ... 21-4 and second plurality 12 contains four web fingers 22-1 ... 22-4. Each web finger is shown as having an aperture 18 sized to receive an integrated circuit device and an adjacent aperture 19 sized to receive a chip capacitor. (It should be observed that the invention is not limited to the specific parameters of the illustrated embodiment but may vary to meet specific requirements.)

Figure 3:
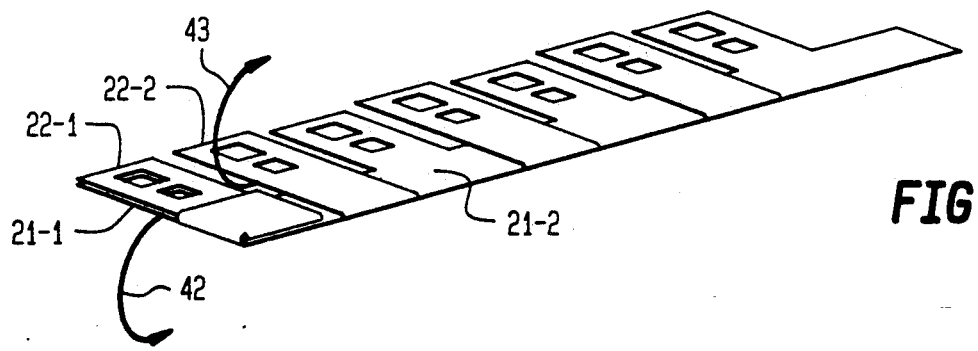
Figure 4:
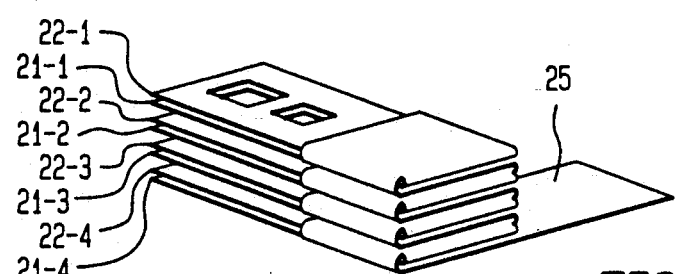

Each web finger is spaced apart from an adjacent web finger by a distance S corresponding to the width W of the finger, plus an additional separation sufficient to accommodate a fold on either side or edge of the finger, whereby, when folded on top of one another as shown in FIGS. 3 and 4, the web fingers are mutually aligned in a stack. In addition, the lengths L22 of web fingers 22 are greater than the lengths L21 of web fingers 21 by the width 27 of central web portion 25 plus an additional fold-accommodating distance.

Figure 2:
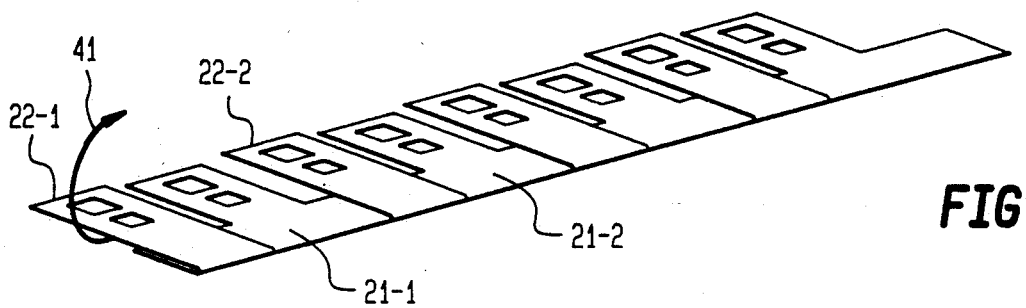

As shown in FIG. 1, the longer web fingers 22 are initially folded in the direction of arrows 31 across of the central web portion 25, so as to be horizontally interleaved with web fingers 21 such that web fingers 21 and 22 are mutually horizontally aligned with one another, as shown in FIG. 2. Following this initial fold, the mutually horizontally aligned web fingers are folded, accordion style, along the lengthwise direction of central web portion 25, as shown by arrow 41 in FIG. 2 and arrows 42 and 43 in FIG. 3, such that the web fingers overlie one another in the form of a vertically aligned stack 50, as shown in FIG. 4. As will be described below with reference to FIGS. 5–8, respective pairs of spacer blocks (not shown in FIG. 4) are engaged with the side edges of each web finger, so as to provide a fold stress-relieving support structure to which the folded arrangement of FIG. 4 is mechanically secured.

Referring now to FIG. 5, a partially exploded view of an individual layer of a stacked packaging assembly in accordance with the present invention is shown as comprising a respective flexible interconnect circuit web finger 61 having a first aperture 63 sized to accommodate an integrated circuit device 65 and a second aperture 67 sized to accommodate a chip capacitor 69. Device 65 is shown as having two sets of leads 71, 73 extending along side edges 75, 77, respectively. It should be observed however, that what is shown is an exemplary embodiment. Leads could extend along all four sides of body 65. Leads 71, 73 are arranged in alignment with conductor tracks (or interconnect links) 81, 83 of web finger 61, so that when device 65 is captured within aperture 63, leads 71, 73 may be bonded to tracks 81, 83. Similarly, chip capacitor 69 has leads 91, 93 extending along side edges 95, 97, respectively. Leads 91, 93 are arranged in alignment with tabs 101, 103 of web finger 61, so that when chip capacitor 67 is captured within aperture 67, leads 91, 93 may be bonded to tabs 101, 103. Web finger 61 also has an alignment element in the form of a slot 111 which is sized to capture an alignment tab 113 of an adjacent heat sink plate 115.

In addition to alignment tab 113, heat sink plate 115 has an aperture 117, aligned with aperture 67 in web finger 61 and sized to accommodate that portion of a chip capacitor that extends through aperture 67 in web finger 61. The heat sink plate is retained at its edges 121, 123 in grooves 125, 127, respectively, of a pair of generally rectangular solid metallic spacer blocks 131, 133. With web finger 61 placed against heat sink plate 115, such that tab 113 fits into slot 111, the bottom surface 76 of device 65, captured in aperture 63 of web finger 61, is in flush contact with heat sink plate 115, so as to provide a thermal flow path from the device through the heat sink plate to the spacer blocks Each spacer block has a pair of bores 141 at its opposite ends, to accommodate a retention fitting (e.g. threaded pin) for clamping a plurality of spacer blocks together in a rigid stacked configuration, as diagrammatically illustrated in FIGS. 6–8. With the spacer blocks of plural ones of the finger layer of FIG. 5 clamped together as shown in FIGS. 6–8, there results a compact laminate structure, which both relieves mechanical stresses at the folds of the web fingers and facilitates attachment of the stacked assembly to an associated housing or motherboard. Since the spacer blocks are mutually contiguous, there is a heat sink path for each circuit device all the way to an underlying support substrate.

A particular advantage of the layered assembly of the present invention is ease of repairability. If one of the circuits fail, its layer can be easily removed, the defective device replaced, tested, and the arrangement reassembled. It should be noted that the manner in which the multilayer structure is attached to an attendant support member is not limited to any particular orientation. For the example, the multilayer arrangement may be attached in a vertical configuration or mounted on edge; it also may be folded into an irregular shape to accommodate different housing/support configurations. The interface feed of the flexible interconnect web allows circuit connections to be made in essentially any orientation.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. An integrated circuit packaging assembly comprising:
   an interconnect substrate in the form of a flexible interconnect circuit web having plurality of finger portions, at least respective one of said finger portions having an aperture therethrough sized to accommodate an integrated circuit device, a respective integrated circuit device passing through and thereby being captured within the aperture of said at least a respective finger portion and having leads extending from a first surface of said respective integrated circuit device and being attached to interconnect links on an adjacent first surface of said at least respective one of said finger portions, and wherein said finger portions are folded together in the form of a stack; and
   a plurality of heat sinks interleaved with the folded finger portions such that a respective heat sink engages and is in thermal contact with a second surface of a respective captured integrated circuit device adjacent to a second surface of a respective folded finger portion.

2. A device according to claim 1, wherein said heat sinks are secured together to form a support structure which relieves mechanical tresses at folds of said finger portions.

3. A device according to claim 2, wherein said heat sinks are secured together by spacer members to which said heat sinks are attached and wherein said spacer members are secured together as a stacked structure.

4. A device according to claim 3, wherein said finger portions and said heat sinks contain mutually engageable alignment elements and wherein an alignment element of a respective heat sink engages an alignment element of a respective finger portion.

5. A device according to claim 1, wherein said flexible interconnect circuit web has plurality of spaced apart finger portions arranged parallel to one another and folded such that said finger portions overlie one another as parallel flexible interconnect web finger portions spaced apart from one another by folds in said flexible interconnect web.

6. A device according to claim 1, wherein said flexible interconnect circuit web has a first web portion, from one side of which a first plurality of spaced apart finger portions extend parallel to one another, and from another side of which a second plurality of spaced apart finger portions extend parallel to one another and to said first plurality of finger portions, said second finger portions being longer than said first finger portions, said second finger portions being folded across said first web portion of said flexible interconnect web, such that said second finger portions are interleaved with said first finger portions along said one side of said flexible interconnect web, and said first and second finger portions being folded in the form of a stack of parallel flexible interconnect web fingers spaced apart from one another by folds therebetween.

7. A device according to claim 1, wherein said first and second pluralities of spaced apart finger portions include chip capacitor mounting regions for receiving chip capacitors, and wherein chip capacitors are surface mounted at the chip capacitor mounting regions thereof such that leads of said chip capacitors are connected to interconnect links of said finger portions.

8. A device according to claim 7, wherein those heat sinks that engage chip capacitors mounted at said chip capacitor mounting regions have corresponding chip capacitor openings for accommodating said mounted chip capacitors.

* * * * *